United States Patent [19]
Ngo et al.

[11] Patent Number: 6,060,393
[45] Date of Patent: May 9, 2000

[54] DEPOSITION CONTROL OF STOP LAYER AND DIELECTRIC LAYER FOR USE IN THE FORMATION OF LOCAL INTERCONNECTS

[75] Inventors: Minh Van Ngo, Union City; Darin A. Chan, Campbell; David K. Foote, San Jose, all of Calif.

[73] Assignee: Advanced Micro Devices, Inc., Sunnyvale, Calif.

[21] Appl. No.: 08/993,888

[22] Filed: Dec. 18, 1997

[51] Int. Cl.$^7$ ..................................... H01L 21/304

[52] U.S. Cl. ........................ 438/690; 438/624; 438/637; 438/631; 438/699

[58] Field of Search ..................................... 438/624, 637, 438/631, 699, 690

[56] References Cited

U.S. PATENT DOCUMENTS

| | | | |
|---|---|---|---|
| 4,803,177 | 2/1989 | Rabinzohn | 438/624 |
| 5,817,572 | 10/1998 | Chiang et al. | 438/624 |

*Primary Examiner*—Felisa Hiteshew
*Assistant Examiner*—Vanessa Perez-Ramos

[57] ABSTRACT

A deposition method allows for the forming of a uniform dielectric stop layer that is substantially void of defects caused by outgassing effects. The stop layer is deposited in a reactor chamber at a higher than normal temperature of at least 480° C. The stop layer is then combined with an overlying dielectric layer to provide an inter-level dielectric structure through which a local interconnect can be formed to provide a conductive path to one or more regions of the underlying semiconductor devices.

12 Claims, 3 Drawing Sheets

DEPOSITION CONTROL OF STOP LAYER AND DIELECTRIC LAYER FOR USE IN THE FORMATION OF LOCAL INTERCONNECTS

RELATED APPLICATIONS

This application is related to co-pending application Ser. No. 08/924,/130, filed Sep. 5, 1997, entitled IN-SITU DEPOSITION OF STOP LAYER AND DIELECTRIC LAYER DURING FORMATION OF LOCAL INTERCONNECTS, now pending.

TECHNICAL FIELD

The present invention relates to semiconductor devices and manufacturing processes, and more particularly to methods for providing improved structures in which local interconnections are formed between two or more regions of a semiconductor device.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. To take advantage of increasing number of devices and to form them into one or more circuits, the various devices need to be interconnected.

To accomplish interconnection on such a small scale, a local interconnect is typically used within an integrated circuit to provide an electrical connection between two or more conducting or semi-conducting regions (e.g., active regions of one or more devices). For example, a plurality of transistors can be connected to form an inverting logical circuit using a local interconnect.

The local interconnect is typically a relatively low-resistance material, such as a conductor or doped semiconductor, that is formed to electrically couple the selected regions. For example, in certain arrangements, damascene techniques are used to provide local interconnects made of tungsten (W), or a like conductor, which is deposited within an etched opening, such as a via or trench that connects the selected regions together. The use of local interconnects reduces the coupling burden on the subsequently formed higher layers to provide such connectivity, which reduces the overall circuit size and as such tends to increase the circuit's performance. Accordingly, as the density of the circuits increase there is a continuing need for more efficient, effective and precise processes for forming smaller local interconnects.

With this in mind, FIG. 1 depicts a cross-section of a portion 10 of a prior-art semiconductor wafer having a stop layer 22 and a dielectric layer 26 as prepared for local interconnect processing using conventional deposition processes. As shown, portion 10 includes a substrate 12 in which one or more devices have been formed. By way of example, portion 10 includes a gate 16 that is part of a field effect transistor having a source region 13a and a drain region 13b formed within substrate 12, as is known in the art. As shown, gate 16, which is typically a conductive material or a semiconductive material, such as, for example, a doped polycrystalline silicon (referred to hereinafter as polysilicon), is formed on a gate oxide 14 (e.g., silicon dioxide $SiO_2$) that has been formed on substrate 12. Oxide spacers 20 have been added to the vertical sidewalls 15 of gate 16 and the exposed top surface of gate 16 has an optional conductive silicide 18 formed thereon. Stop layer 22, which is a dielectric material, such as, for example, silicon nitride (e.g., $Si_3N_4$), has been deposited over the exposed surfaces of portion 10 using a conventional stop layer deposition process. Dielectric layer 26 has been deposited over stop layer 22 also using a conventional deposition process.

Although stop layer 22 and dielectric layer 26 are both dielectric materials, preferably they are different enough in composition such that subsequent etching processes are capable of etching through dielectric layer 26 while essentially stopping at stop layer 22, thereby avoiding the possibility of etching into substrate 12 and the device regions (e.g., regions 13a–b) formed therein. Without stop layer 22, the etching process would likely extend too far into substrate 12 which could damage existing structures therein and/or cause circuit failures by introducing electrical shorts and other similar problems after the local interconnect has been completed.

Thus, stop layer 22 provides improved process control in the formation of local interconnects which are usually formed using damascene techniques. For example, if dielectric layer 26 is a tetraethlorthosilicate (TEOS) oxide layer and stop layer 22 is a silicon oxynitride ($SiO_xN_y$) layer, then a subsequent oxide etching process that exhibits a high selectivity to silicon oxynitride can be used to remove selected portions of dielectric layer 26. For example, an octaflourobutene ($C_4F_8$) based plasma has a high etch rate for TEOS oxide but a low etch rate for silicon oxynitride.

As depicted in FIG. 1, there is also shown several defects, such as defect 24, that tend to form at the interface between stop layer 22 and dielectric layer 26. Defect 24 is typically created by outgassing effects that occur at the interface during the conventional deposition processes. Defect 24, in certain circumstances, creates topology problems in subsequent layers, such as, dielectric layer 26 that includes a bump 28 above defect 24. In some integrated circuits, defect 24 changes the electrical properties of the various layers, materials, and/or device structures, which affects performance and/or causes the circuit/device to fail during operation. In other circumstances, bump 28 and/or defect 24 present topology problems that hinder or otherwise harm subsequently formed overlying layers, and/or reduce the capabilities of subsequently employed defect inspection techniques/tools to provide an accurate assessment of the fabricated structure.

Thus, as illustrated in FIG. 1, there is a need for methods for reducing or eliminating defects, such as defect 24, during the formation of two or more dielectric layers which are subsequently patterned to form openings for local interconnects.

SUMMARY OF THE INVENTION

The present invention provides methods for substantially reducing outgassing defects, such as defect 24 in the prior art of FIG. 1, during the formation of a stop layer and a subsequent overlying dielectric layer. In accordance with one aspect of the present invention, the temperature of the semiconductor wafer within the deposition reactor is maintained at a higher than normal temperature which results in a stop layer that is substantially void of outgassing-related defects.

Thus, in accordance with one embodiment of the present invention, the above needs are met by a method that includes forming a device within a substrate of the semiconductor wafer, and depositing a first layer of a first dielectric material over the device at a temperature of at least approximately 480° C. The method further includes depositing a second layer of a second dielectric material over the first layer, and forming a conductive path that extends through the first and second layers to the device. In certain embodiments, depositing of the first layer includes depositing the first dielectric layer by plasma enhanced chemical vapor deposition (PECVD), and the first layer includes $SiO_xN_y$. In other embodiments, the second layer includes TEOS oxide.

In yet another embodiment of the method, the deposition of the first and second layers occurs in-situ within a reactor chamber in which the internal pressure is maintained at a significantly lower pressure during the deposition of the first layer and the deposition of the second layer.

The above stated needs are also met by a method for forming a dielectric layer, suitable for use in forming a conductive path, in a semiconductor wafer. This method includes depositing a stop layer on a substrate of the semiconductor wafer within a deposition reactor chamber having a temperature of at least approximately 480° C., and depositing a dielectric layer on the stop layer.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

Figure 1:
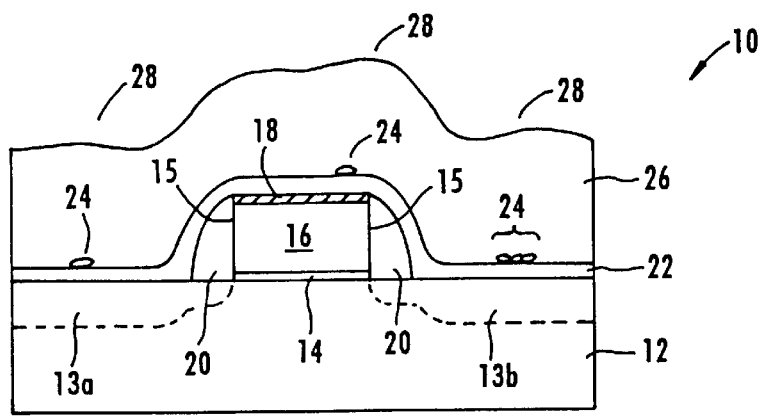
FIG. 1 depicts a cross-section of a portion of a semiconductor wafer having a stop layer and a dielectric layer as prepared for local interconnect processing using conventional deposition processes.
Figure 2A:
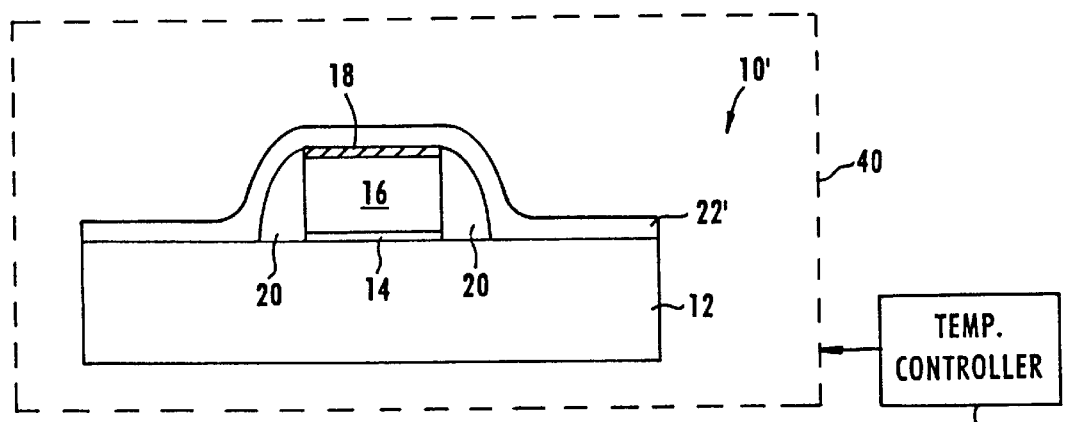
FIGS. 2a and 2b depict a cross-section of a portion of a semiconductor wafer during the formation of a stop layer and then an overlying dielectric layer using an improved deposition process, in accordance with one embodiment of the present invention.
Figure 2B:
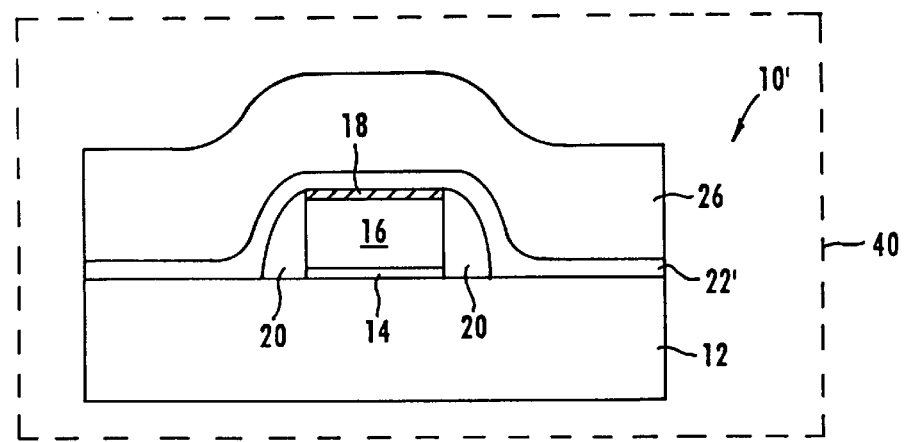

In accordance with an embodiment of the present invention, there is provided an improved deposition process for use in fabricating a dual-layer dielectric, including a stop layer 22' and an overlying dielectric layer 26 (see FIG. 2b). For example, the dual-layer dielectric in accordance with certain embodiments of the present invention includes a thick dielectric layer 26 over a thin stop layer 22'. This structure is then advantageously used to increase the process control during formation of local interconnects. The improved deposition process substantially reduces if not completely eliminates the formation of deleterious defects, such as defect 24 in FIG. 1. In accordance with one embodiment of the present invention, the deposition temperature, which is monitored and controlled during the deposition of stop layer 22', has been increased to substantially reduce outgassing defects on the stop layer 22'.

In accordance with yet another embodiment of the present invention, the higher deposition temperature process is used to deposit stop layer 22' in-situ with dielectric layer 26, to eliminate the need to relocate or otherwise move the semiconductor wafer between different process tools. This helps to further reduce the process cycle times and thereby increases throughput. The combined higher deposition temperature process and in-situ deposition process substantially decreases, and in many cases eliminates, defects such as the outgassing defects that typically form between the stop layer and dielectric layer in conventional separate deposition processes.

As such, the methods of the present invention provide better process control over the local interconnect etching and fabrication process, reduce the likelihood of damaging the semiconductor wafer/devices, speed up production, and reduce manufacturing costs.

FIGS. 2a and 2b depict an exemplary cross-section of an improved portion 10' of a semiconductor wafer during the deposition of a stop layer 22' and then a dielectric layer 26 as prepared for local interconnect processing using either separate deposition processes, or an in-situ deposition process, in accordance with the present invention. As shown in FIG. 2b, the interface between stop layer 22' and dielectric layer 26 is free from defects, such as defect 24 of FIG. 1.

Referring to FIG. 2a, stop layer 22' is deposited within a conventional deposition reaction chamber, which is schematically indicated by dashed lines and reference numeral 40. During the deposition process, the temperature within the reaction chamber 40 is monitored and controlled, for example, using a temperature controller 41, to provide improved process control. Temperature controller 41, can be dedicated circuits and/or devices that are configured to monitor and control the temperature of the wafer within reactor chamber 40. For example, temperature controller 41 in certain embodiments is part of the reaction chamber controlling hardware and software that is provided by the manufacture of the process tool. By way of example, the AMAT 5000 available from Applied Materials, Inc. of Santa Clara, Calif. has exemplary temperature controlling devices.

Prior-art deposition processes tend to maintain the deposition temperature at less than 400° C. At these deposition temperatures, a typical silicon nitride or silicon oxynitride stop layer 22 (see FIG. 1) of about 800 Å is deposited in about 4 seconds. By maintaining a deposition temperature of less than or about 400° C., it is the general perception within the industry that the reactor chamber 40 and associated hardware lasts longer (e.g., increased mean time to failure) and that the fast deposition time beneficially increases the throughput.

As part of the present invention, however, it has been determined that higher deposition temperatures have the benefit of substantially reducing the outgassing defects that the prior art deposition processes tended to suffer from. Thus, in accordance with the present invention, the deposition temperature is significantly increased to at least approximately 480° C. At such a significantly higher deposition temperature, stop layer 22' is formed substantially without outgassing defects being formed. While the deposition process is significantly longer (e.g. seconds) than that of the prior art, it has further been found that the formation of stop layer 22' is more controlled, e.g., more uniform, due to the longer deposition time. For example, in a plasma-enhanced chemical vapor deposition (PECVD) tool, the plasma has additional time to stabilize which tends to produce a more controlled deposition process.

In accordance with yet another embodiment of the present invention, an in-situ deposition process is combined with the higher deposition temperature process to form both stop layer 22' and dielectric layer 26. By being deposited in-situ, there is less chance that defects can be introduced on the surface of stop layer 22'. Consequently, the combined processes significantly prohibit, if not entirely eliminate, any such outgassing-related defects by maintaining, throughout the in-situ deposition process, a low pressure environment in a deposition reactor chamber and, if applicable, in a load lock chamber coupled to the reactor chamber. In FIGS. 2 and 3, the deposition reaction chamber is schematically indicated by dashed lines and reference numeral 40. Because of the increased deposition temperature and the low-pressure environment most, if not all, of the outgassing and similar defect causing mechanisms are either avoided or removed from stop layer 22' prior to the deposition of dielectric layer 26.

The higher temperature deposition process, and the combined higher temperature/in-situ deposition process of the present invention are described below as part of a local interconnect formation process (e.g., see FIGS. 4a and 4b, respectively). However, before describing this local interconnect formation process, the resulting local interconnect process and resulting structure is first described for exemplary portion 10' as depicted in FIGS. 3a and 3b.

Figure 3A:
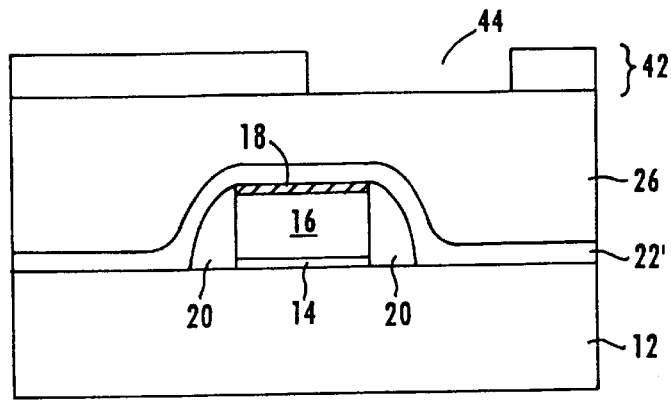
FIGS. 3a and 3b depict the portion of FIG. 2b following the formation of a local interconnect that extends through the stop layer and dielectric layer, in accordance with one embodiment of the present invention.
Figure 3B:
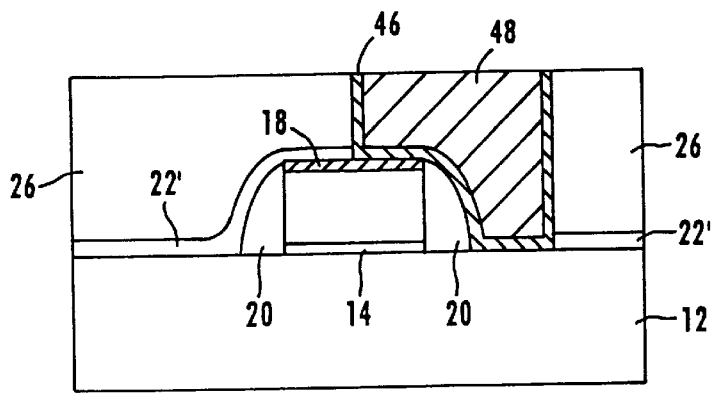

In FIG. 3a, dielectric layer 26 has been planarized, for example, using a chemical-mechanical polish (CMP) process. A patterned resist mask 42, having an etching window 44, has been formed on top of dielectric layer 26. In FIG. 3b, a local interconnect has been formed using damascene techniques wherein materials of dielectric layer 26 and stop layer 22' have been removed from below etching window 44, for example, using a plasma etching process. Next, one or more conductive materials, such as glue layer 46 and plug 48 are deposited within the etched opening created through dielectric layer 26 and stop layer 22' to make electrical contact with underlying structure.

In an exemplary embodiment of the present invention, substrate 12 includes a heavily-doped silicon substrate layer that is approximately 2 mm thick and on which there is grown a lightly-doped epitaxial (epi) layer that is approximately 4 $\mu$m thick. Gate oxide layer 14 is approximately 55 Å thick, and gate 16, which is preferably made of polycrystalline silicon, is approximately 1,700 Å thick. In this embodiment, silicide 18 is a thin titanium-silicide layer formed on the exposed top surface of gate 16. Stop layer 22' is a thin film or layer of silicon oxynitride that is approximately 800 Å thick. Dielectric layer 26 is a layer of TEOS oxide. Dielectric layer 26, as shown in FIG. 2b, is a conformal layer that is deposited until approximately 12,000 Å thick. In a subsequent step, the exposed top surface of dielectric layer 26 is planarized down, for example, using an oxide CMP process, to a thickness of approximately 6500 to 9500 Å (see FIGS. 3a–b).

Figure 4A:
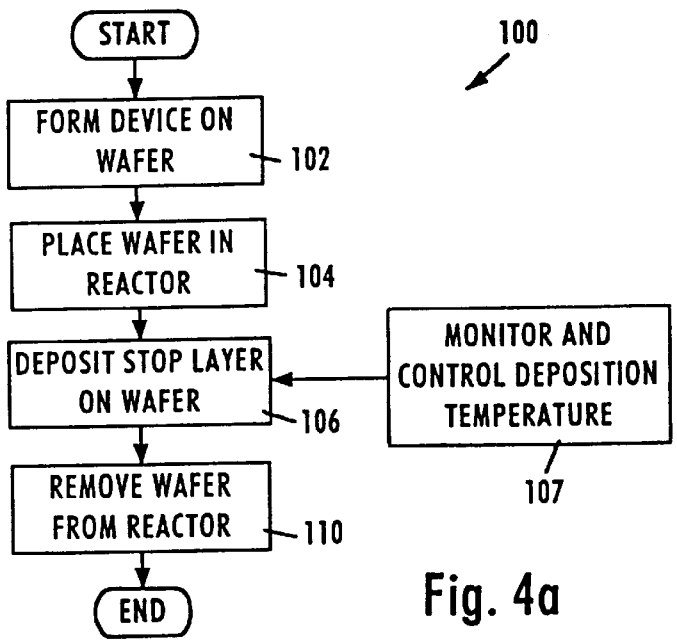
FIG. 4a depicts a flow-chart of a method for depositing a stop layer using an improved deposition process, in accordance with one embodiment of the present invention.

FIG. 4a depicts a flow chart of a method 100 for forming a stop layer 22' using a higher deposition temperature process in accordance with one embodiment of the present invention. Method 100 includes forming a device on a semiconductor wafer, in step 102, using conventional semiconductor device fabrication processes. By way of example, portion 10' of FIG. 1 without stop layer 22 and dielectric layer 26 represents an exemplary wafer having such a device. In step 104, the wafer is placed in a CVD or a like deposition system. Next, in step 106, a stop layer 22', for example silicon oxynitride, is deposited on the wafer and the temperature is maintained at approximately 480° C. (or higher) via step 107. By way of example, silicon oxynitride is formed in a PECVD system using silane ($SiH_4$), nitrous oxide ($N_2O$) and nitrogen ($N_2$). Then in step 110, the wafer is removed from the reactor. By way of example, portion 10' of FIG. 2a depicts an exemplary wafer as a result of method 100.

Figure 4B:
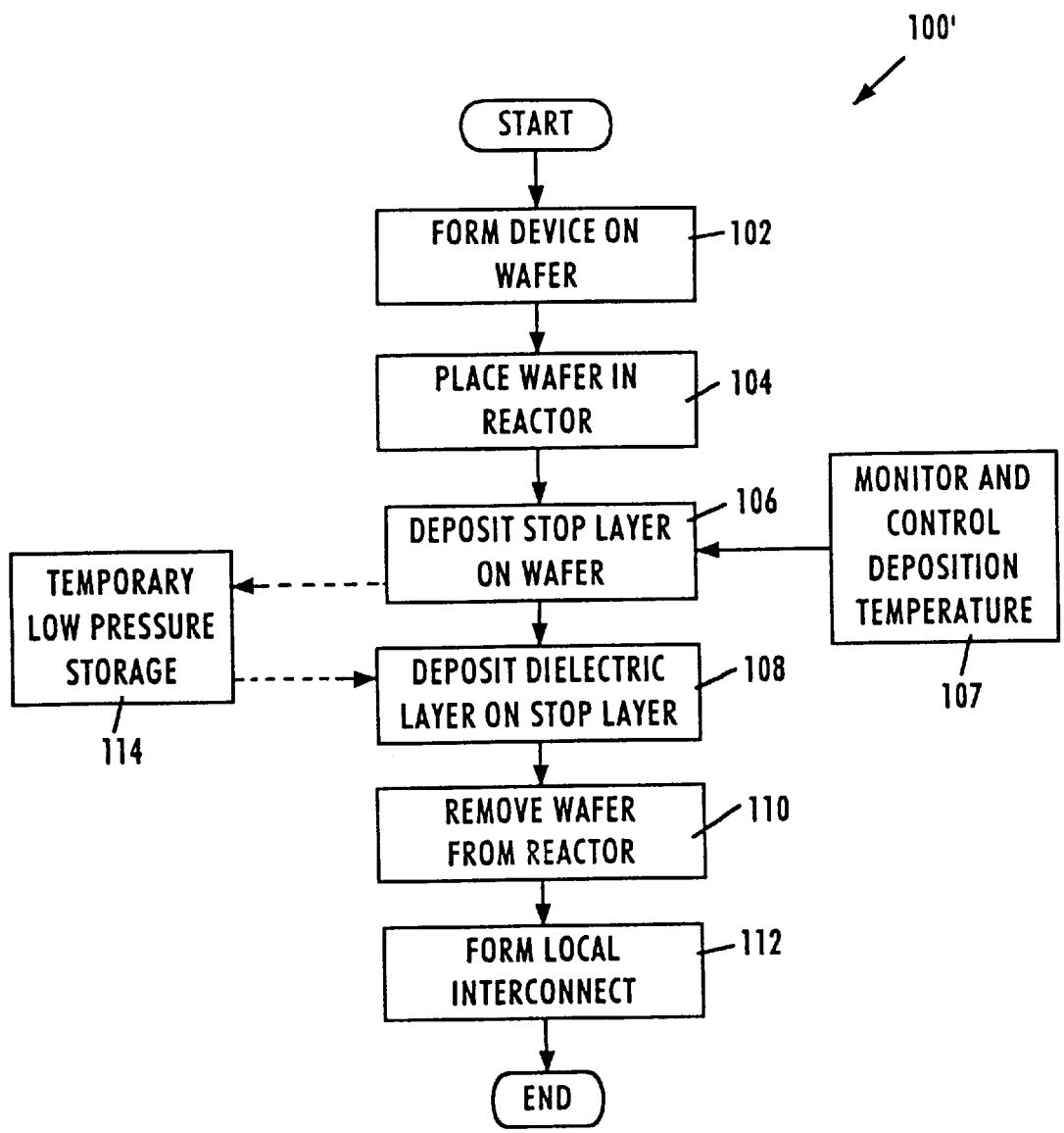
FIG. 4b depicts a flow-chart of an in-situ method for depositing a stop layer and an overlying dielectric layer using an improved deposition process, in accordance with one embodiment of the present invention.

FIG. 4b depicts a flow chart of a method 100' for forming a local interconnect, such as the local interconnect of FIG. 3b, using a combined higher deposition temperature process and in-situ deposition process in accordance with one embodiment of the present invention. Method 100' includes forming a device on a semiconductor wafer, in step 102, using conventional semiconductor device fabrication processes. By way of example, portion 10' of FIG. 1 without stop layer 22 and dielectric layer 26 represents an exemplary wafer having such a device. In step 104, the wafer is placed in a CVD or a like deposition system. Next, in step 106, a stop layer 22', for example silicon oxynitride, is deposited on the wafer and the temperature is maintained at approximately 480° C. (or higher) via step 107. This is followed by an in-situ deposition of a dielectric layer 26, for example TEOS oxide, in step 108. The wafer remains in the deposition system's reactor chamber 40 during steps 106 and 108, and the pressure within the reactor chamber 40 is kept significantly low (e.g. sub-ambient) during these steps.

In accordance with certain embodiments that include a multiple wafer handling system, once a wafer has been processed per step 106, the wafer can be temporarily held in a lord lock (or similar apparatus) under low pressure until such time as step 108 begins and the wafer is placed back in the reactor chamber 40. This is represented by step 114 in FIG. 4b, for example. In step 110, the wafer is removed from the reactor. By way of example, portion 10' of FIG. 2 depicts an exemplary wafer as a result of step 110. The wafer is then processed, in step 112, to form at least one local interconnect using conventional damascene techniques. Thus, for example, portion 10' of FIG. 3 depicts an exemplary local interconnect formed as a result of step 112.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method for forming a local interconnect in a semiconductor wafer, the method comprising:

forming a device within a substrate of the semiconductor wafer;

depositing a first layer of a first dielectric material over the device at a temperature of at least approximately 480° C.; and depositing a second layer of a second dielectric material over the first layer; and forming a conductive path that extends through the first and second layers to the device.

2. The method as recited in claim 1, wherein the depositing of the first layer includes depositing at least the first dielectric layer by plasma enhanced chemical vapor deposition (PECVD).

3. The method as recited in claim 2, wherein the first layer comprises $SiO_xN_y$.

4. The method as recited in claim 2, wherein the second layer comprises TEOS oxide.

5. The method as recited in claim 2, wherein depositing the first and second layers occurs in-situ and further includes placing the semiconductor wafer in a reactor chamber and maintaining a sub-ambient pressure within the reactor chamber during the deposition of the first layer and the deposition of the second layer.

6. The method as recited in claim 2, wherein the first layer comprises $SiO_xN_y$ and has a thickness of approximately 800 Å.

7. The method as recited in claim 2, wherein the second layer comprises TEOS oxide and has a thickness of approximately 12,000 Å.

8. The method as recited in claim 1, wherein the forming of a conductive path includes:

creating an etched opening by etching through a selected portion of the second layer and stopping at the first layer;

extending the etched opening by further etching through an exposed portion of the first layer and stopping on the device within the substrate; and filling the extended etched opening with at least one electrically conductive material.

9. The method as recited in claim 8, wherein the forming of a conductive path further includes planarizing the second layer prior to etching through the selected portion of the second layer.

10. A method for forming a dielectric layer, suitable for use in forming a conductive path, in a semiconductor wafer, the method comprising:

depositing a stop layer on a substrate of the semiconductor wafer within a deposition reactor chamber having a temperature of at least approximately 480° C.; and depositing a dielectric layer on the stop layer.

11. The method as recited in claim 10, wherein the stop layer comprises $SiO_xN_y$ and has a thickness of approximately 800 Å.

12. The method as recited in claim 10, wherein the dielectric layer comprises TEOS oxide and has a thickness of approximately 12,000 Å.

* * * * *